(12) United States Patent
Baillargeon et al.

(10) Patent No.: US 6,563,852 B1
(45) Date of Patent: May 13, 2003

(54) SELF-MODE-LOCKING QUANTUM CASCADE LASER

(75) Inventors: James Nelson Baillargeon, Sugar Land, TX (US); Federico Capasso, Westfield, NJ (US); Alfred Yi Cho, Summit, NJ (US); Claire F. Gmachl, New Providence, NJ (US); Albert Lee Hutchinson, Piscataway, NJ (US); Roberto Paiella, Short Hills, NJ (US); Deborah Lee Sivco, Warren, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/566,348

(22) Filed: May 8, 2000

(51) Int. Cl.[7] .............................. H01S 5/00; H01S 3/098
(52) U.S. Cl. .............................. 372/45; 372/46; 372/18
(58) Field of Search ................................ 372/18, 43–45, 372/46

(56) References Cited

U.S. PATENT DOCUMENTS

| | | | |
|---|---|---|---|
| 5,457,709 A | | 10/1995 | Capasso et al. |
| 5,509,025 A | * | 4/1996 | Capasso et al. ............... 372/45 |
| 5,570,386 A | * | 10/1996 | Capasso et al. ............... 372/46 |
| 5,696,784 A | * | 12/1997 | Srinivasan et al. ........... 372/46 |
| 5,727,010 A | | 3/1998 | Capasso et al. |
| 5,901,168 A | | 5/1999 | Baillargeon et al. |
| 5,920,586 A | * | 7/1999 | Nagai .......................... 372/46 |
| 5,936,989 A | | 8/1999 | Capasso et al. |
| 5,960,020 A | * | 9/1999 | Nagai .......................... 372/46 |
| 6,031,859 A | | 2/2000 | Nambu |
| 6,055,254 A | | 4/2000 | Capasso et al. |
| 6,055,257 A | | 4/2000 | Baillargeon et al. |

OTHER PUBLICATIONS

Faist et al. "High–Power Continuous–Wave Quantum Cascade Lasers" IEEE Journal of Quantum Electronics, vol. 34, No. 2, Feb. 1998, pp. 336–343.*
Mordechai, Segev, Ilan Gravé, Amnon Yariv, "Demonstration of the Optical Kerr Effect at 10.6 $\mu$m via Intersubband Nonlinearities in a Multi–Quantum Well Structure" Applied Physics Letters 61 (20), Nov. 16, 1992.
Federico Capasso, Carlo Sirtori, Alfred Y. Cho, "Coupled Quantum Well Semiconductors with Giant Electric Field Tunable Nonlinear Optical Properties in the Infrared", IEEE Journal of Quantum Electronics, vol. 30, No. 5, May 1994.
E. Rosencher, A. Fiore, B. Vinter, V. Berger, Ph. Bois, J. Nagle "Quantum Engineering of Optical Engineering" Science, vol. 271, Jan. 22, 1996.
Susumu Noda, Tetsuya Uemura, Takao Yamashita, Akio Sasaki, Analysis on Interband–Resonant Light Modulation by Intersubband–Resonant Light in n–Doped Quantum Wells, IEEE Journal of Quantum Electronics, vol. 28, No. 2, Feb. 1992.

(List continued on next page.)

Primary Examiner—Paul Ip
Assistant Examiner—James Menefee
(74) Attorney, Agent, or Firm—Wendy W. Koba, Esq.

(57) ABSTRACT

A self-mode-locking (SML) mid-infrared (5 and 8 $\mu$m) quantum cascade laser is formed that comprises both a relatively thin dielectric insulating layer (i.e., less than one-half micron in thickness) overlaid with an optically highly lossy (i.e., absorbing) layer, with a relatively long (approximately 3.5 mm) optical waveguide. Evidence of mode-locking is obtained from the measured optical spectra and corresponding interferograms, as well as from the rf spectra of the photocurrent detected with a fast quantum-well infrared photodetector. An estimate for the pulse width of approximately 3 psec is inferred from these data.

17 Claims, 8 Drawing Sheets

OTHER PUBLICATIONS

A. Neogi, H. Yoshida, T. Mozume, O Wada, "Ultrafast All–Optical Modulation of Interband–Light Pulses by Ultra–Short Intersubband Light Pulses in Semiconductor Quantum Wells" Journal of Applied Physics, vol. 85, No. 6, Mar. 15, 1999.

G. Nykolak, P.F. Szajowski, G. Tourgee, H. Presby, "2.5 Gbit/s Free Space Optical Link Over 4.4 Km" Electronics Letters $1^{st}$. Apr., 1999, vol. 35, No. 7.

Claire Gmachl, A. Michael Sergent, Alessandro Tredicucci, Federico Capasso, Albert L. Hutchinson, Deborah L. Sivco, James N. Baillargeon, S.N. George Chu, Alfred Y. Cho, "Improved CW Operation of Quantum Cascade Lasers with Epitaxial–Side Heat–Sinking" IEEE Photonics Technology Letters, vol. 11, No. 11 Nov. 1999.

Roberto Paiella, Federico Capasso, Claire Gmachl, Clyde Bethea, Deborah L. Sivco, James N. Baillargeon, Albert L. Hutchinson, Alfred Cho "High–Speed Operation of Gain–Switched Midinfrared Quantum Cascade Lasers" Applied Physics Letters, vol. 75, Oct. 25, 1999, No. 17.

C. H. Lin, T. K. Gustafson, "Optical Pulsewidth Measurement Using Self–Phase Modulation" IEEE Journal of Quantum Electronics, Apr. 1972.

G. Steinmeyer, D. H. Sutter, L. Gallman, N. Matuschek, U. Keller "Frontiers in Ultrashort Pulse Generation: Pushing the Limits in Linear and Nonlinear Optics" Science, vol. 286, Nov. 19, 1999.

L. F. Mollenauer, R. H. Solen, "The Soliton Laser" Optic Letters, vol. 9, No. 1, Jan. 1984.

D. E. Spence, P. N. Kean, W. Sibbett, "60–Fsec Pulse Generation from a Self–Mode–Locked Ti:Sapphire Laser" Optic Letters, vol. 16, No. 1, Jan. 1991.

Francois Salin, Jeff Squier, Michelle Piche, "Mode–Locking of Ti:Al$_2$O$_3$ Lasers and Self–Focusing: A Gaussian Approximation" Optic Letters, vol. 16, No. 21, Nov. 1, 1991.

Herman A. Haus, Theory of Mode Locking with a Slow Saturable Absorber, IEEE Jorunal of Quantum Electronics, vol. QE–11, No. 9, Sep. 1975.

Herman A. Haus "Theory of Mode Locking with Fast Saturable Absorber", Journal of Applied Physics, vol. 46, No. 7, Jul. 1975.

Jerome Faist, Federico Capasso, Deborah L. Sivco, Carlo Sirtori, Albert L. Hutchinson, Alfred Y. Cho, "Quantum Cascade Laser", Science, vol. 264, Apr. 22, 1994.

Federico Capasso, Claire Gmachl, Alessandro Tredicucci, Albert L. Hutchinson, Deborah L. Sivco, Alfred Y. Cho, High Performance Quantum Cascade Lasers, Optics & Photonics News, Oct. 1999.

H. C. Liu, Jian Meng Li, M. Buchanan, Z. R. Wasilewski, "High Frequency Quantum–Well Infrared Photodetectors, Measured by Microwave–Rectification Technique" IEEE Jorunal of Quantum–Electronics, vol. 32, No. 6, Jun. 1996.

C. H. Lin, T. K. Gustafson, "Optical Pulsewidth Measurement Using Self–Phase Modulation" Physical Review Letters, vol. 65, No. 1, Jul. 2, 1990.

* cited by examiner

SELF-MODE-LOCKING QUANTUM CASCADE LASER

GOVERNMENT CONTRACTS

This invention was made in part with Government support under Contract No. DAAG55-98-C-0050, awarded by the DARPA/US Army Research Office. The Government has certain rights in this invention.

FIELD OF THE INVENTION

The present invention relates to a quantum cascade laser and, more particularly, to a quantum cascade laser structure that is capable of self-mode-locking behavior in the mid-infrared wavelength range.

BACKGROUND OF THE INVENTION

Over the past few decades, there has been an extensive research effort focused on the development of "ultrafast" laser sources, that is, sources capable of generating optical pulses with durations ranging from a few picoseconds down into the femtosecond range. Some of these ultrashort pulses have been generated in a variety of gas and solid-state laser media. These sources have allowed for a dramatic improvement in the temporal resolution of a myriad of measurements in physics, chemistry and biology. The need for increased bandwidth in optical communications is another factor influencing the design and development of ultrafast laser sources. Ultrafast semiconductor lasers are particularly important for telecommunications applications, given their compact size, high efficiency, low cost and unmatched pulse repetition rates (up to a few hundred of GHz).

The most commonly used approach to the generation of ultrashort laser pulses is the technique of mode-locking. In general terms, mode-locking results from a periodic modulation of the laser gain with the fundamental period equal to the cavity roundtrip time. Under these conditions, maximum gain is experienced by a laser beam consisting of a train of pulses, separated by the roundtrip time, and properly synchronized with the modulation. An optical waveform with these characteristics is established through the coherent addition of several longitudinal modes of the laser cavity, when the modes are phase-locked to one another. The characteristics of such a device are often described in the frequency domain. In this description, when the laser is modulated at the cavity roundtrip frequency (i.e., the frequency separation between adjacent modes), several modes are driven above threshold by the modulation sidebands of their neighbors, which automatically establishes the phase-locking required for pulsed laser emission.

In general, the modulation responsible for mode-locking may be produced by an external source (defined as "active" mode-locking), or by the laser pulses themselves through some intracavity optical nonlinearity (defined as "passive", or "self" mode-locking). Typically, the shortest pulse durations and the largest repetition rates can be obtained with self-mode-locking (SML) and several techniques of SML have been demonstrated over the past few years. In each case, a nonlinear mechanism is required that reduces the losses with an increasing optical power. One exemplary arrangement is an intracavity saturable absorber; that is, an absorber whose opacity at the laser wavelength decreases with increasing intensity. Alternatively, a nonlinear mirror or a nonlinear coupled-cavity (with larger reflectivity at higher power levels) may be used. Another effective mechanism, discovered in association with Ti:sapphire lasers, is self-focusing or Kerr-lensing, which requires an intracavity medium with a positive nonlinear refractive index. That is, a refractive index that increases with increasing intensity. In such a medium with a positive nonlinear refractive index, the center part of the beam transverse profile (where the intensity is higher) experiences a larger index, and is therefore slowed down in its propagation relative to the edges. Thus, the nonlinear medium acts as a positive lens narrowing the beam diameter, to an extent proportional to the optical power; this effect can then be converted into a saturable loss mechanism simply by using an intracavity slit or aperture.

Regardless of the nature of the nonlinear mechanism, it is essential that the loss recovers from saturation on an "ultrafast" time scale, in particular, on a time scale that is much faster than the cavity roundtrip time. In other words, after the passing of each pulse, the losses must quickly return to their steady-state (relatively high) value before the arrival of the next pulse, so as to prevent light emissions between consecutive pulses. The relaxation lifetime of the SML nonlinearity also limits the resulting optical pulse widths. For these and other reasons, all prior art demonstrations of self-mode-locking having relied upon an ultrafast nonlinearity, either provided by an external medium added inside the cavity, or by a nonresonant transition in the laser host medium.

In principle, an "intrinsic" nonlinear refractive index is present in any laser medium, provided by the lasing transition itself and related to the gain coefficient through a Kramers-Kronig transformation. This is a resonant nonlinearity, and therefore inherently large, so that one may expect that, combined with the appropriate cavity configuration (e.g., a coupled-cavity system, or an intracavity aperture), a laser medium with a sufficiently large intrinsic nonlinear refractive index could be used to provide a self-mode-locking laser. However, since such nonlinearity involves a real population transfer across the lasing transition, its dynamic response is limited by the lifetime of the upper laser state. In mode-locked lasers developed to date, this lifetime is much slower than (or comparable to) the cavity roundtrip time, and therefore fails to satisfy the above-mentioned requirements for SML.

In general, therefore, mode-locked lasers of the prior art have been limited to an "extrinsic" structure, requiring the use of an externally added non-linearity, or loss "discriminator" to provide the mode locking capability. The use of one or more external components increases both the cost and complexity of the mode-locked laser system.

Thus, a need remains in the art for an intrinsic self-starting/self-sustaining mode-locked semiconductor laser arrangement, i.e., a laser system where the laser transition itself provides the nonlinear component of the mode-locking mechanism.

SUMMARY OF THE INVENTION

The need remaining in the prior art is addressed by the present invention, which relates to a self-mode locking laser and, more particularly, to a quantum cascade laser structure that is capable of self-mode-locking behavior in the mid-infrared wavelength range.

In accordance with the present invention, quantum cascade lasers characterized by intersubband transitions having large index nonlinearities (due to their extremely large dipole moments) are used to generate picoseconds pulses of mid-infrared light. In particular, Kerr-lens mode-locking of a QC laser is provided by the index nonlinearity of the intersubband lasing transition.

The intracavity aperture required to convert the QC self-focusing mechanism into a loss modulation is provided by a QC laser waveguide that is characterized by: (1) an optically highly lossy (i.e., absorbing) layer (such as a metal, for example), separated from the semiconductor material by a relatively thin dielectric layer such that it "sees" (i.e., optically interacts with) the optical wave formed in the active region; and (2) a relatively long laser waveguide (such that the propagation losses dominate over other losses, such as mirror losses). In one embodiment, the highly lossy layer used for mode coupling can comprise a metal and be disposed to also form one of the electrical contacts for the laser device.

Various attributes of the present invention will become apparent during the course of the following discussion and by reference to the accompanying drawings.

BRIEF DESCRIPTION OF THE DRAWINGS

Referring now to the drawings.

DETAILED DESCRIPTION

Figure 1:
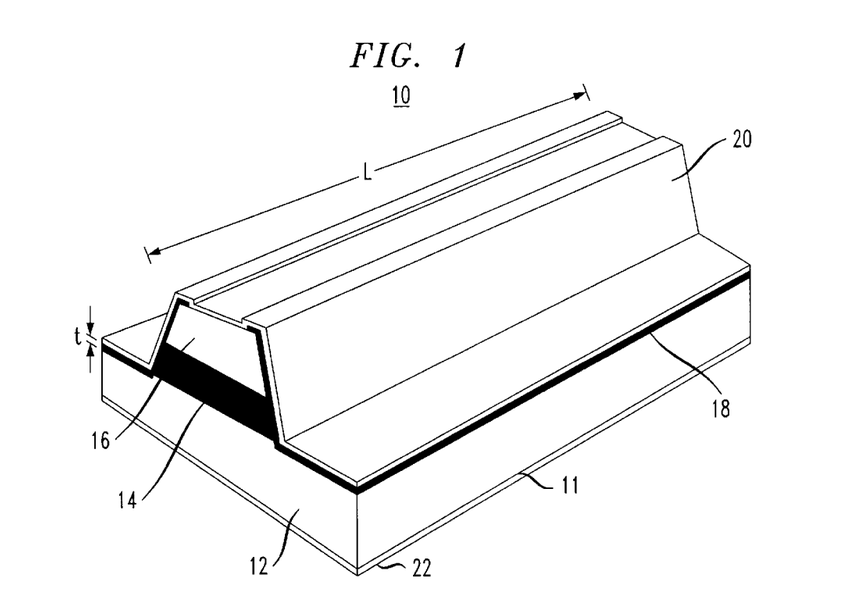
FIG. 1 is an isometric view of an exemplary SML QC laser of the present invention.

An isometric view of an exemplary QC laser 10 capable of self-mode-locked (SML) operation is illustrated in FIG. 1. QC laser 10 comprises an active region 14 sandwiched between an upper cladding region 16 and a lower cladding region 12. At least upper cladding region 16 and active region 14 have the shape of an elongated mesa typical of ridge waveguide laser structures. An electrical insulating layer 18 (for example, silicon nitride or silicon dioxide) is formed over the top of the device and is patterned to form an opening which exposes a portion of the top of the mesa. A top side metal contact 20 is formed to coat insulating layer 18, as well as to cover the exposed portion of upper cladding region 16. A second electrode 22 is formed across the bottom surface of substrate 11. Substrate 11 itself may be a single crystal semiconductor body or a combination of such a body with another layer (e.g., an epitaxial layer grown on the top surface of the body). Illustratively, layers of this type are fabricated from Group III–V compound semiconductors; e.g., In-based Group III–V compounds such as GaInAs and AlInAs. Here, the laser beam is primarily confined by the cladding regions 12,16 immediately surrounding active region 14. In particular, a strong confinement of the beam can be achieved by forming cladding regions 12,16 such that they have a first high-refractive index layer (such as low doped InGaAs) adjacent to active region 14, followed by a second low-refractive index material layer (such as InAlAs or InP) As a result, the confinement does not depend critically on the index of the gain medium, so that no significant self-focusing is expected in this direction.

In accordance with the teachings of the present invention, two conditions are required in the QC laser structure to provide for self-mode locking. First, insulating layer 18 must be relatively thin (e.g., a thickness, denoted t, of less than 0.5 $\mu$m). The relatively thin layer is required for the optical wave within active region 14 to "see" (i.e., optically interact with) metal layer 20, thus providing mode coupling to metal layer 20. However, insulating layer 18 must not be so thin so as to allow for a direct electrical path to be formed between metal layer 20 and active region 14 (that is, insulating layer 18 must be thick enough to prevent the formation of an electrical short in the device). Second, the extent of the waveguide ridge, denoted "L" in FIG. 1, is required to be relatively long (for example, $\geq$3.5 mm), so that propagation losses will dominate over mirror losses. It has been found, as will be discussed in detail below, that the combination of these two characteristics leads to self-mode locking in QC lasers.

Figure 2:
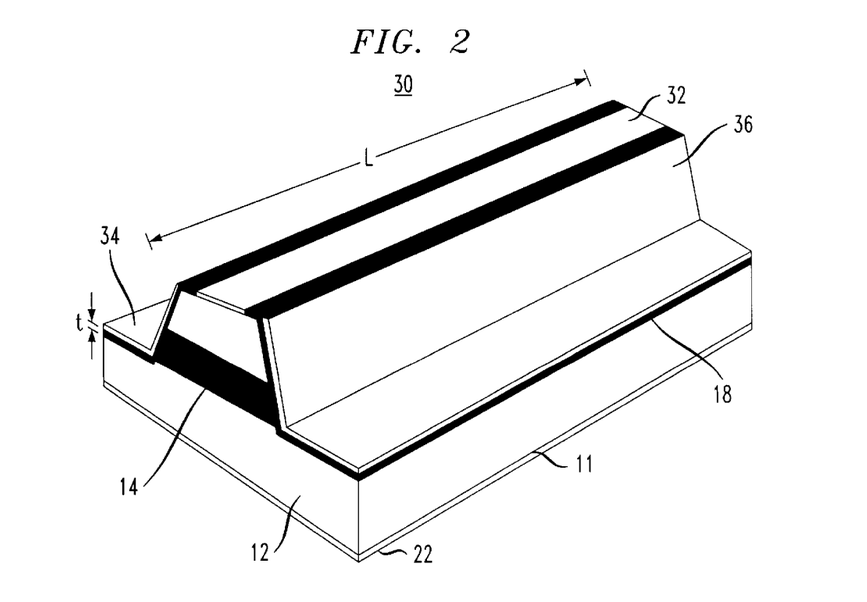
FIG. 2 illustrates an alternative SML QC laser structure, utilizing separate metal layers for the mode coupling and the electrical contact.

An alternative embodiment 30 of the present invention is illustrated in FIG. 2, where in this arrangement, a separate top electrical contact 32 and highly optically lossy sidewall layers 34,36 are used. Sidewall layers 34,36 are disposed as shown to cover thin insulating layer 18 in the region of interest surrounding active region 14. Top electrical contact 32 is disposed in the opening created in insulating layer 18 and provides for the direct electrical contact to upper cladding layer 16. In general, since these layers perform different functions, they may comprise different thicknesses, or even different compositions. For the purposes of the present invention, the layers of concern are sidewall layers 34,36 which are required to provide mode coupling to the optical wave within active region 14. As with the arrangement of FIG. 1, the thickness t of insulating layer 18 must be well-controlled such that mode coupling will occur, and the length of the waveguide must by sufficient to insure that self-mode-locking will take place. It is to be noted that in the particular situation where the highly lossy sidewall layers are themselves electrically insulating, a separate insulator 18 will not be required and that aspect incorporated directly into the lossy sidewall layers.

In one arrangement highly optically lossy sidewall layers 34,36 may comprise metal layers (such as gold, for example), and may even comprise the same material as top contact 32 and deposited on the sidewalls during the same processing step. In general, however, highly optically lossy layers 34,36 may comprise any suitable (i.e., lossy or absorbing) material. That is, any material capable of providing sufficient mode coupling in the lateral direction and loss for the light guided in the waveguide. For example, several polymeric substances (such as polyimide) are generally known to exhibit a strong resonant absorption in the mid-infrared wavelength range.

Figure 3:
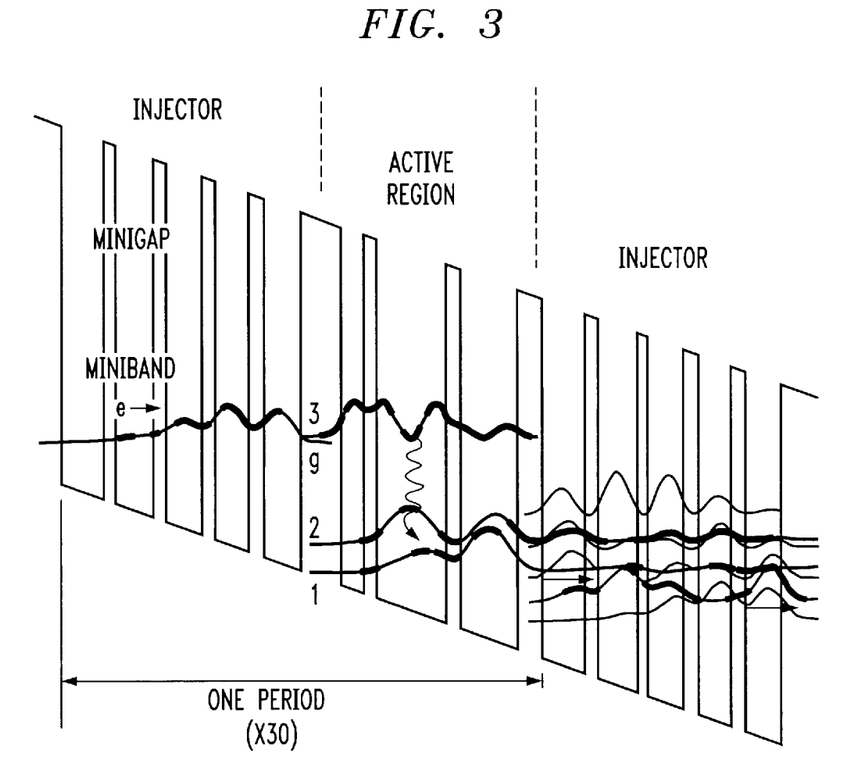
FIG. 3 contains a schematic energy diagram for the operation of a conventional quantum cascade (QC) laser.

As is known in the art, QC lasers consist of several (usually between 25 and 30) repeat units of radiative transition regions, (termed "active region" in FIG. 3) and injector regions such as illustrated in FIG. 3, stacked in series in a cascade configuration to form active region 14. In most cases, the laser material is grown by molecular beam epitaxy in a InGaAs/AlInAs material system that is lattice-matched to a low-doped InP substrate (such as substrate 11). It is then processed by wet chemical etching into the mesa structure as shown in FIGS. 1 and 2. As has become well known, QC laser action is based on intersubband electron transitions, i.e., transitions between quantized conduction-band states in coupled quantum-wells. A distinctive feature of these transitions is their ultrafast relaxation times, typically a few picoseconds, which is at least two orders of magnitude faster than in all other laser systems. The electronic band structure of a conventional QC laser active region (i.e. radiative transition region) is illustrated in FIG. 3. Essentially, it comprises a three-level system, where carriers are injected into the upper state (labeled "3" in FIG. 3) by tunneling through a thin heterostructure barrier, and extracted from the lower laser state (labeled "2") by LO phonon-assisted scattering into state 1. The key feature in the context of the present invention is that phonon emission is also extremely effective in depopulating upper state 3, thereby resulting in picoseconds carrier lifetimes (much shorter than the typical roundtrip times in QC lasers, which are on the order of several tens of picoseconds).

Furthermore, intersubband transitions are characterized by giant index nonlinearities, due to their extremely large dipole moments. In accordance with the present invention, these transitions are used to generate picoseconds pulses of mid-infrared light. In particular, Kerr-lens mode-locking of a QC laser is achieved, resulting from the index nonlinearity of the intersubband lasing transitions. The intracavity aperture required to convert the self-focusing mechanism into a loss modulation is provided by the QC laser waveguide under the conditions defined above, namely, the use of a relatively thin dielectric overlaid by a strongly absorbing (i.e., highly optically lossy) material, and a long waveguide region. Possible applications of such a QC self-mode-locking laser include time-resolved spectroscopy in the mid-infrared wavelength range, where a large variety of chemical and biological species have their tell-tale absorption features associated with molecular vibrations. The SML QC lasers of the present invention are also suitable for use in high-speed free-space communication systems, given the low atmospheric losses of mid-infrared light.

Figure 4:
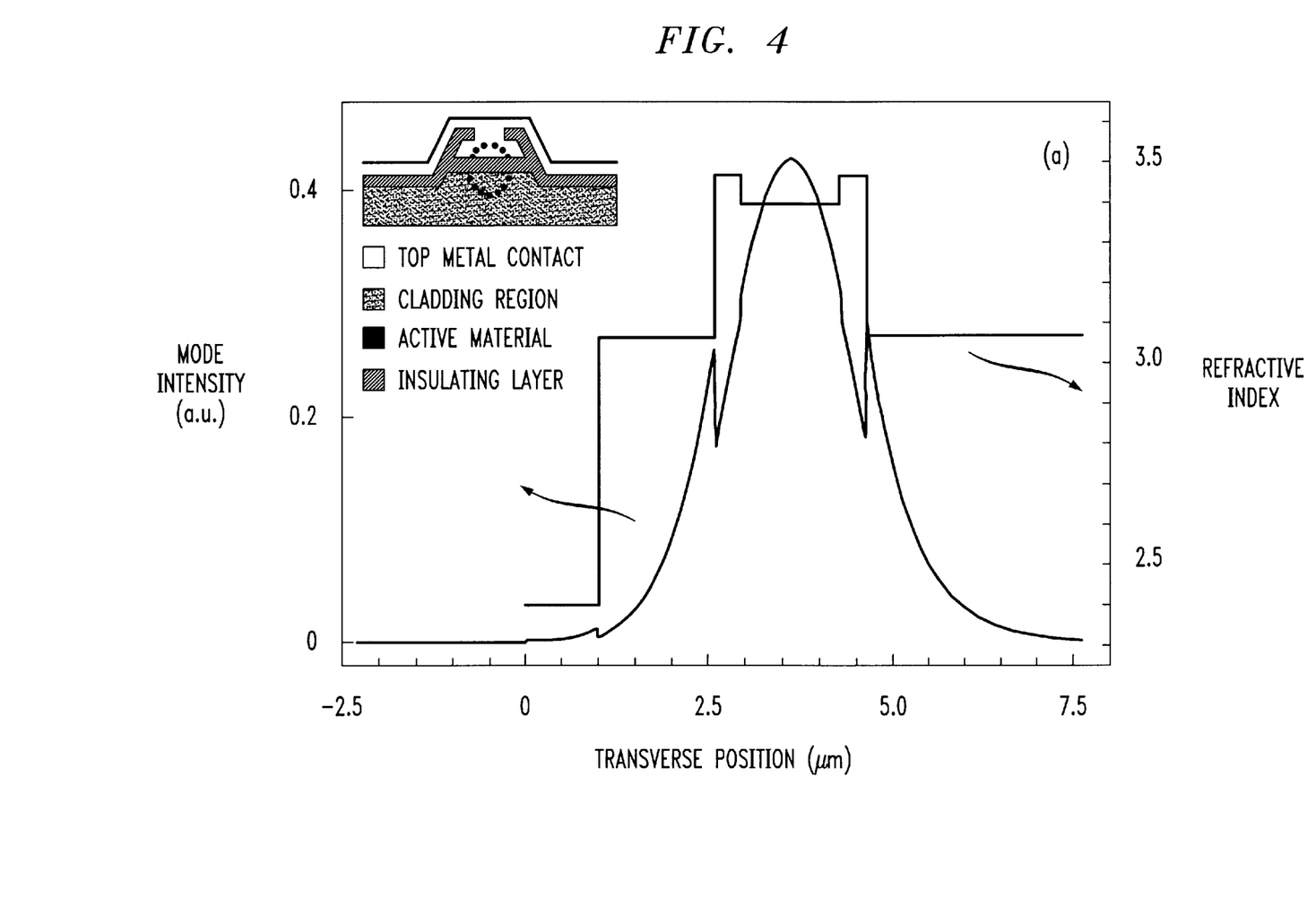
FIG. 4 illustrates the refractive index profile and resulting intensity distribution of the fundamental waveguide mode along the transverse direction (i.e., perpendicular to the active layer) for the SML QC lasers of FIG. 1 or 2.
Figure 5:
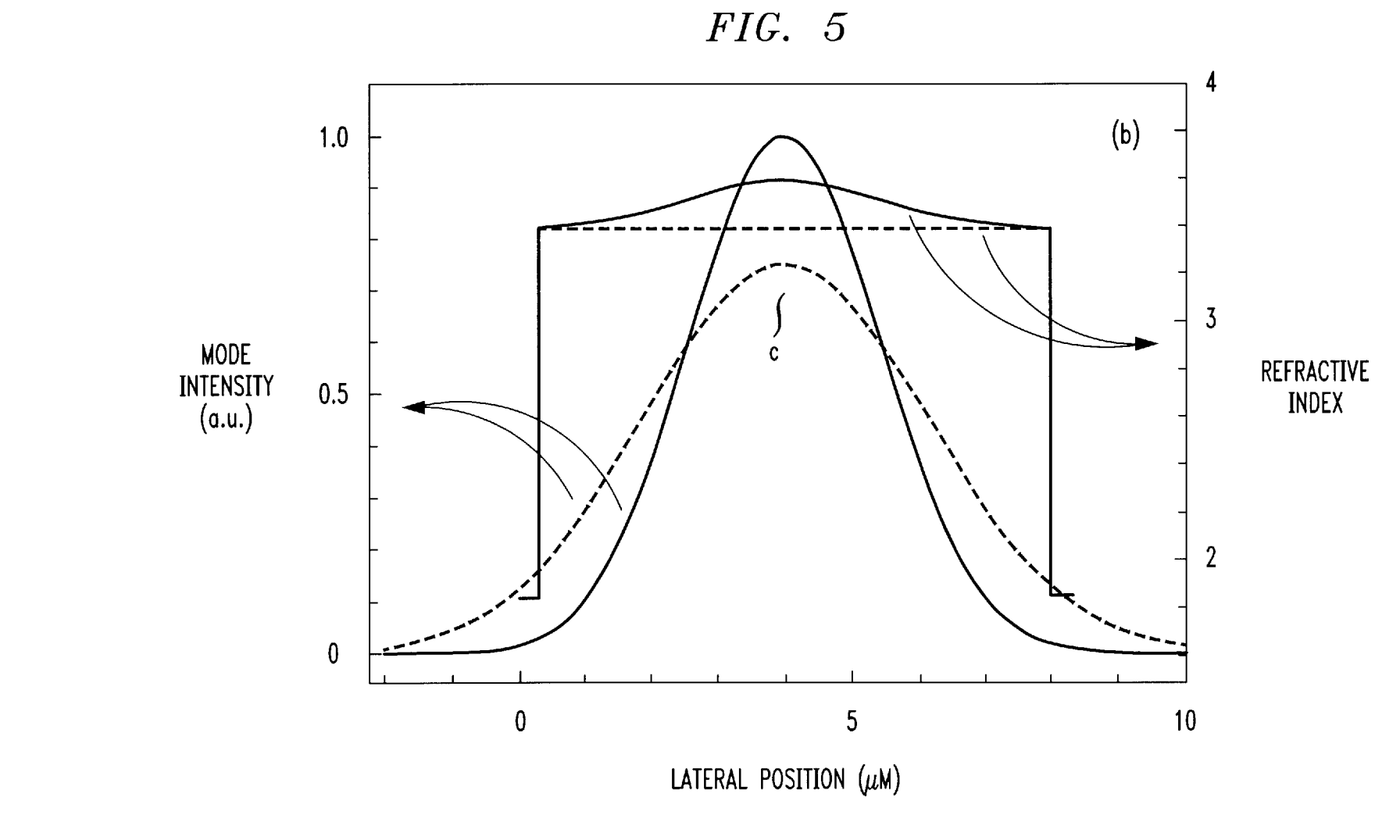
FIG. 5 illustrates the refractive index profile and resulting intensity distribution of the fundamental waveguide mode along the lateral direction (i.e., parallel to the active layer) for the SML QC laser of FIG. 1.

FIG. 4 illustrates both the refractive index profile and resulting intensity distribution in the transverse direction of the fundamental mode of an exemplary QC laser as depicted in FIGS. 1 and 2. As mentioned above, self-focusing does not occur in the transverse direction, since the mode is primarily confined by the cladding layers surrounding the active material (i.e., the regions of highest index in FIG. 4), where no such strong nonlinearity exists. FIG. 5 illustrates the refractive index profile and resulting intensity distribution along the lateral direction of the same device (i.e., parallel to the active layer). Self-focusing occurs in the lateral direction as a result of the strong index nonlinearity of the active region, as shown. That is, as the intensity increases (noted as going from the dashed curve to the continuous curve) the index near the center of the waveguide increases (noted by the letter "C" in FIG. 5), and the beam is correspondingly more tightly confined. In the lateral direction, the waveguiding results mainly from the difference between the effective index of the semiconductor stack (i.e., the combination of regions 12,14 and 16) and the complex index of the overlying dielectric and optically lossy layers. The semiconductor stack has a large contribution from the gain medium itself (active region 14), and is therefore highly nonlinear. Consequently, as shown in FIG. 5, an increase in optical power leads to a focusing of the laser beam via the Kerr effect. The increase in optical power then causes a larger overlap with the gain region, and a reduced overlap with the lossy external absorbing (e.g., metal) layers, thereby producing the saturable loss mechanism required for self-mode locking.

As mentioned above, in order to obtain self-mode locking in QC lasers of the present invention, this nonlinear contribution needs to be the primary portion of the overall cavity losses in the QC device. Accordingly, the use of a relatively thin dielectric (i.e., <0.5 $\mu$m) between the semiconductor material and the metal sidewall layers ensures that there will be sufficient mode coupling to the metal. Gold is one exemplary metal that may be used for this purpose. In order to allow for such losses to dominate over mirror losses, a relatively long cavity (e.g., L >3.5 mm) is also a necessity.

Figure 6:
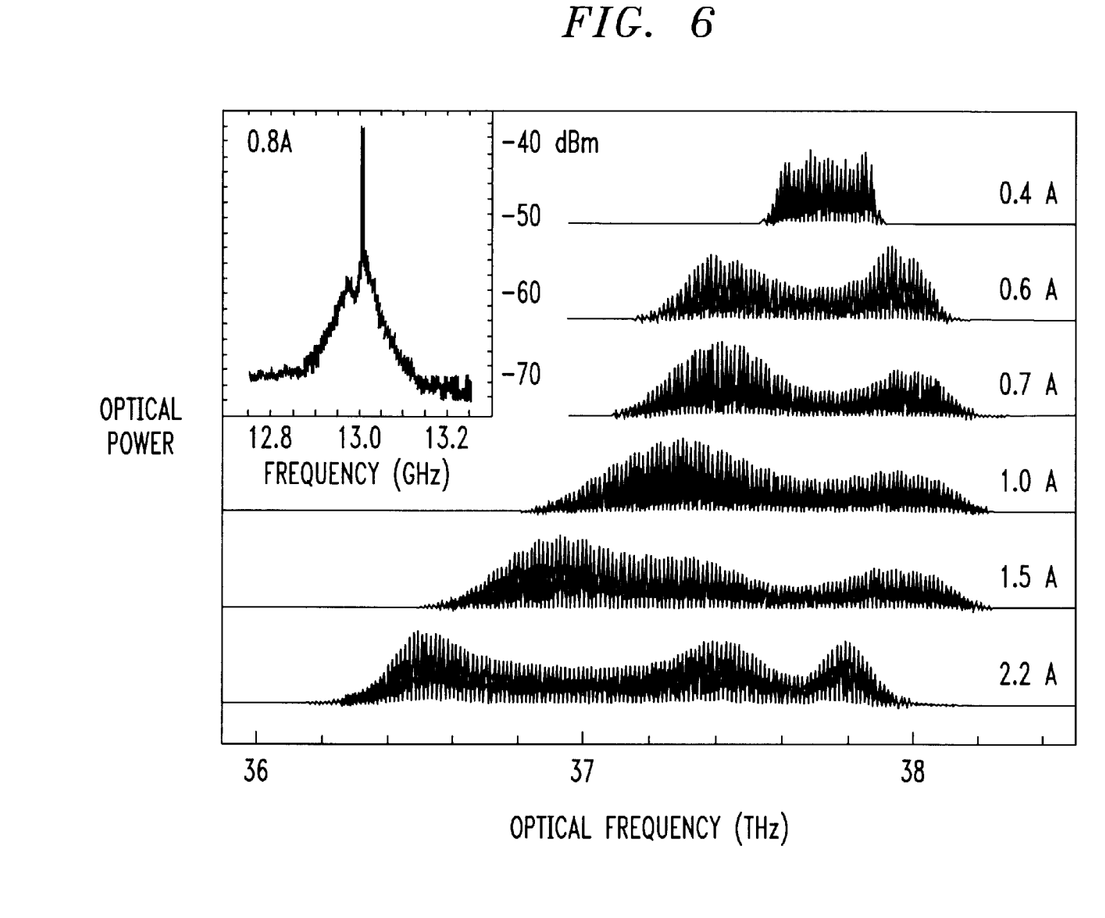
FIG. 6 contains a graph of the optical spectra of an exemplary SML QC laser of the present invention for different values of laser dc bias current.
Figure 7:
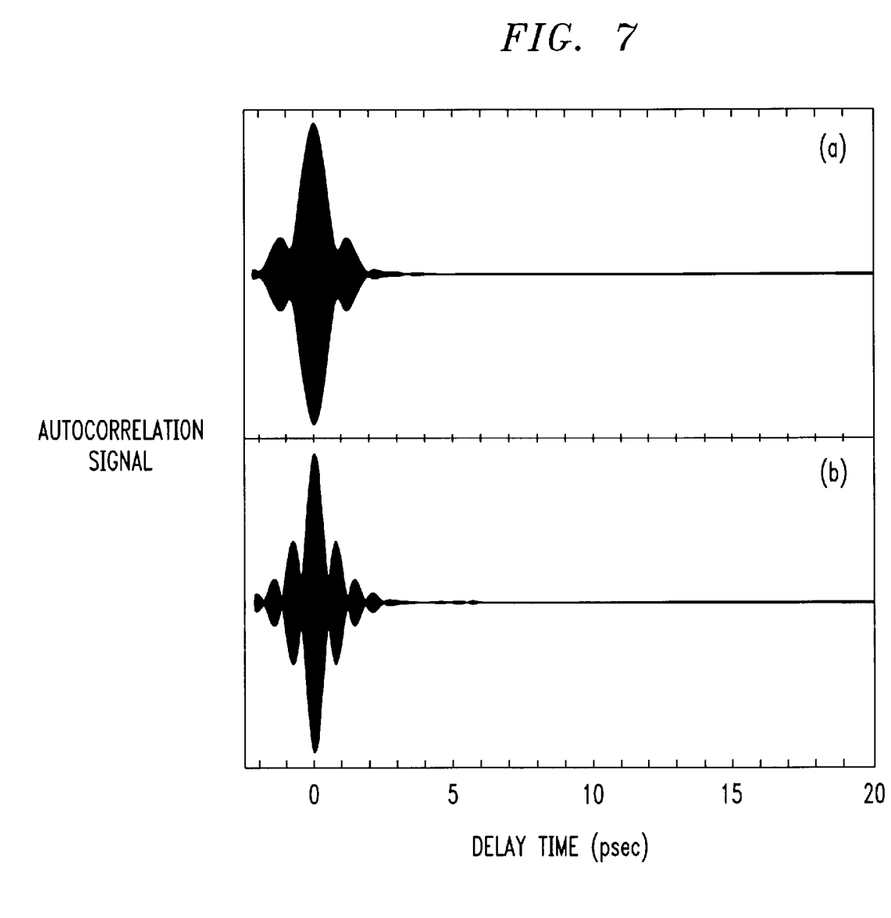
FIGS. 7A and 7B illustrate linear autocorrelation traces under conditions of SML for an exemplary 8 $\mu$m device (FIG. 7A) and an exemplary 5 $\mu$m device (FIG. 7B)

Experimental evidence of self-mode-locking in a QC laser formed in accordance with the present invention is illustrated in the measurements illustrated in FIGS. 6 and 7. In particular, several QC lasers were made to study their SML capabilities, emitting at either 5 or 8 $\mu$m (chosen only as representatives of the two atmospheric windows, and should be considered as exemplary only). These devices consisted of a relatively large number (25–30) of radiative transition regions forming active region 14, stacked in series in a cascade configuration. The laser material was grown by molecular beam epitaxy in the InGaAs/AlInAs material system and lattice matched to low-doped InP substrates. The laser material was then processed by wet chemical etching into the ridge waveguide structure as discussed above. The individual lasers were then wire bonded, soldered to a copper heat sink, and mounted on a temperature-controlled cold finger of a helium flow cryostat. The light output from these devices was detected with a fast (12 GHz nominal bandwidth), quantum well infrared photodetector (QWIP), mounted inside a liquid-nitrogen dewar. Optical spectral measurements were performed with a Fourier transform infrared spectrometer (FTIR).

For each laser tested, there was a range of dc bias in which the laser emitted in an extremely broad (>1 THz) multimode spectrum, characterized by a smooth multi-peaked envelope; outside of this range, the device reverts to single-mode cw emission. A series of these spectra is shown in FIG. 6, for an 8 $\mu$m QC laser held at a heat sink temperature of 80° K. The phase-locked nature of these multimode spectra was verified by detecting the laser output with a QWIP, and displaying the resulting photocurrent in a spectrum analyzer. In particular, a broad structure centered at the laser roundtrip frequency (approximately 13 GHz for one particular device) was observed, as shown in the inset of FIG. 6. This feature, resulting from the mutual beating of adjacent modes in the optical spectrum, was found to be extremely stable, indicating negligible random drift of the modes relative phases, as expected in a mode-locked laser. Its large spectral width (over 150 MHz) is due to the variation of the index, and hence of the modes separation frequency, over the optical bandwidth. A similar feature can also be observed in the rf spectrum of the QC laser current, measured through a high-speed bias "tee", indicating effective modulation of the laser gain.

These results clearly demonstrate that the lasing modes are indeed locked in phase to one another. However, the measurements as recorded and depicted in FIG. 6 do not give any indication as to whether the modes amplitudes are such that their coherent addition results in picosecond pulses. An examination of the linear autocorrelation traces of the laser output, generated by the Michelson interferometer in the FTIR and shown in FIG. 7, confirms the presence of the desired picosecond pulses. The results are shown for both an 8 μm device (FIG. 7A) and a 5 μm device (FIG. 7B). When the light beam in the interferometer consists of ultrashort pulses, the interference fringes making up these traces can only occur when the pulses from the two arms of the interferometer temporally overlap on the detector. Therefore, the negligible amplitude of the fringes observed in FIGS. 7A and B for large delay times between the two arms indicates pulsed emission with a good modulation depth. It is to be noted, however, that these traces cannot provide an accurate measurement of the duration of the pulses since they are affected by their phase as well as amplitude.

The pulse width can, however, be estimated from the multi-peaked structures observed in the optical spectra (directly related to the side lobes in the autocorrelation traces of FIG. 7), using a procedure first outlined in an article entitled "Optical Pulsewidth Measurement Using Self-Phase Modulation", by C. H. Lin et al., appearing in *IEEE J. of Quantum Electronics*, Vol. 8, 1972, beginning at page 429. In the context of ultrafast laser pulses, these multi-peaked structures are a signature of self-phase modulation, which can be described as the temporal analog of self-focusing. That is, in the presence of a quadratic index nonlinearity, the optical field develops a time-varying phase proportional to the pulse intensity profile. Correspondingly, the optical spectrum broadens to:

$$\Delta\omega_{rms} = \frac{\sqrt{2\log 2}}{\tau_p}\sqrt{1 + \frac{4}{3\sqrt{3}}\phi_{max}^2},$$

where $\Delta\omega_{max}$ is the root-mean square spectral width, $\tau_p$ is the full-width at half-maximum (FWHM) pulse width, and a Gaussian pulse shape is presumed. Finally, $\phi_{max}$ is the maximum nonlinear phase shift, given by $$\phi_{max} = \frac{2\pi L}{\lambda} n_2 I_{max},$$

where L is the propagation length (in this case, the laser roundtrip path), λ is the wavelength, $n_2$ is the nonlinear index, and $I_{max}$ is the pulse peak intensity. Furthermore, theoretical studies indicate that a first dip appears in the optical spectrum when $\phi_{max}$ reaches the value 3/2 π; and further dips are predicted to occur at higher values $\phi_{max}$.

Referring to the spectra in FIG. 6, a pronounced dip is observed, starting approximately at the bias of 0.6 A. Thus, using equation (1) with $\phi_{max}$=3/2 π, and with $\Delta\omega_{rms}$ equal to the measured rms width of the spectrum at 0.6 A (250 GHz), an estimate for the pulse duration is $\tau_p$=3.2 psec. It is to be noted that this is an approximate result, primarily since it does not account for group-velocity dispersion; however, this effect is likely to be important, especially at the larger values of dc bias, due to the concomitant spectral broadening.

Figure 8:
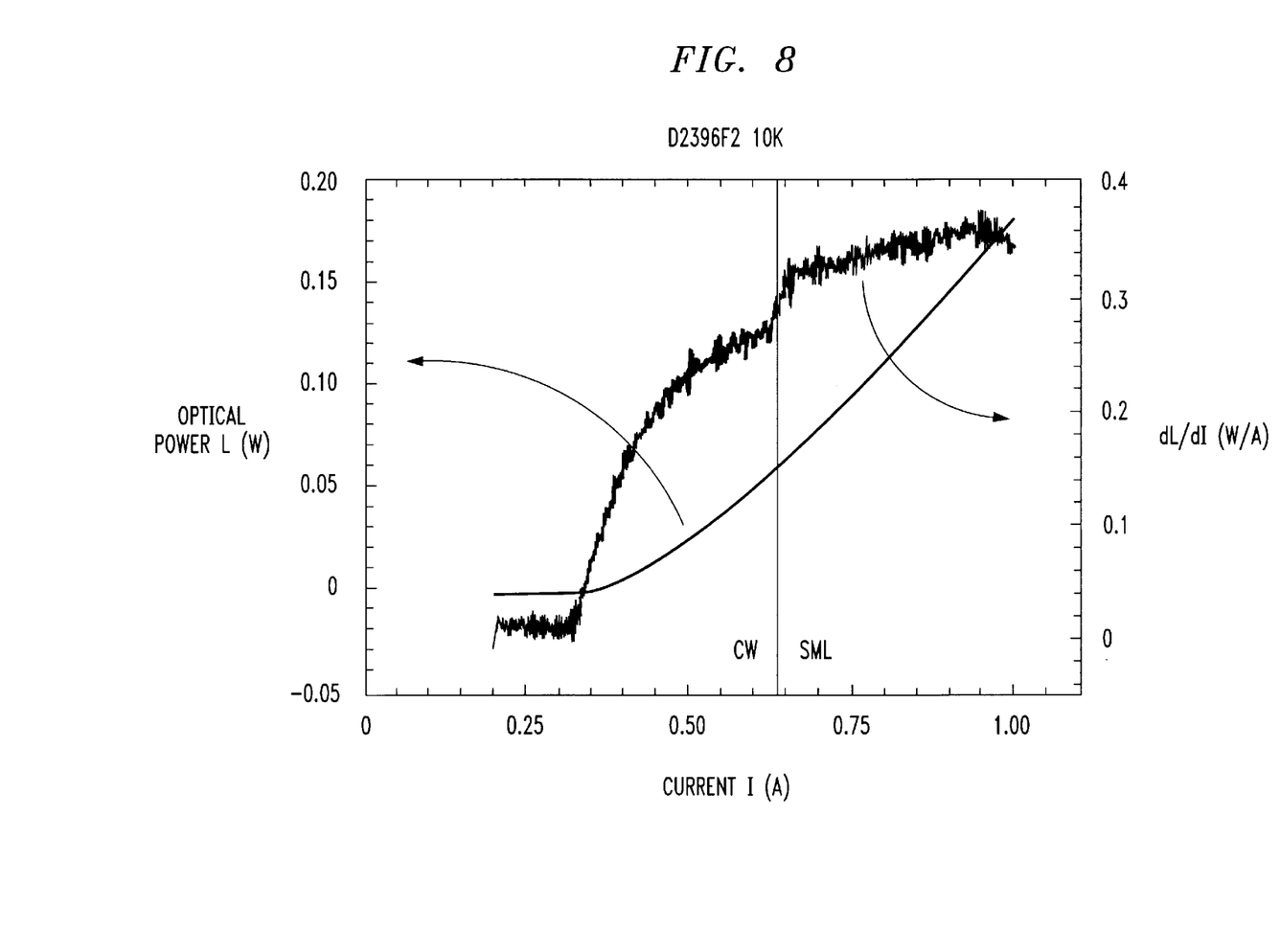
FIG. 8 contains a plot of both dL/dI and optical power, as a function of bias current, for an SML QC laser of the present invention.

With respect to the output power of the self-mode-locking lasers, a slow pyroelectric detector can be used to measure the L-I characteristics of an SML QC device (i.e., average optical power versus bias current). The transition from cw to SML operation can be seen in the curves of FIG. 8, in the form of a sudden increase in the slope efficiency dL/dI. Furthermore, from the measured average power, the peak power of the pulses can be estimated, given the knowledge of their width and repetition rate. In general, the peak encompasses values ranging from a few hundreds of milliwatts to well over a watt, depending on the operating conditions.

For definite evidence regarding the origin of the self-mode-locking phenomenon, the far-field beam profile can be measured and compared under both cw vs. SML operation. In one instance, such a measurement was taken using a QC laser in which SML was found to be non self-starting. This particular device exhibited single-mode cw emission at 8 μm when biased with a dc current. Mode-locking was achieved by superimposing an rf modulation on the dc bias that was resonant with its roundtrip frequency (as in active mode locking). However, the laser then remained in the mode-locked state, even after the modulation was switched off. This device was particularly well-suited for this measurement since it allowed for the comparison of two cases (i.e., cw and self-starting) under the same conditions of bias, temperature, etc. It was found that the far-field beam profile under SML conditions was broader than in cw, corresponding to a narrower beam inside the waveguide. Therefore, at the higher instantaneous power levels inherent to pulsed emission, the beam does undergo self-focusing inside the laser. The ratio in beam diameter between the cw and SML cases was found to increase with dc bias (and hence, optical power), and it was measured to be as large as 1.33.

Regarding the physical origin of the observed index nonlinearity, it can be shown that given the relatively low power levels of these mode-locked pulses (on the order of several hundreds of milliwatts), a nonlinear index $n_2$ as large as $10^{-9}$ cm²/W is required in equation (2) to produce the observed nonlinear phase shift of $\phi_{max}$=3/2 π. In comparison, this is a seven orders of magnitude larger than the nonlinear index responsible for Kerr-lens mode-locking in Ti:sapphire lasers. Consequently, nonresonant processes such as two-photon absorption, electronic Raman scattering, and optical Stark effect, which have been observed to produce a Kerr nonlinearity in semiconductors, can all be ruled out as sources, since their resulting nonlinearities are too weak ($n_2 \sim 10^{-12}$ cm²/W, or smaller).

Figure 9:
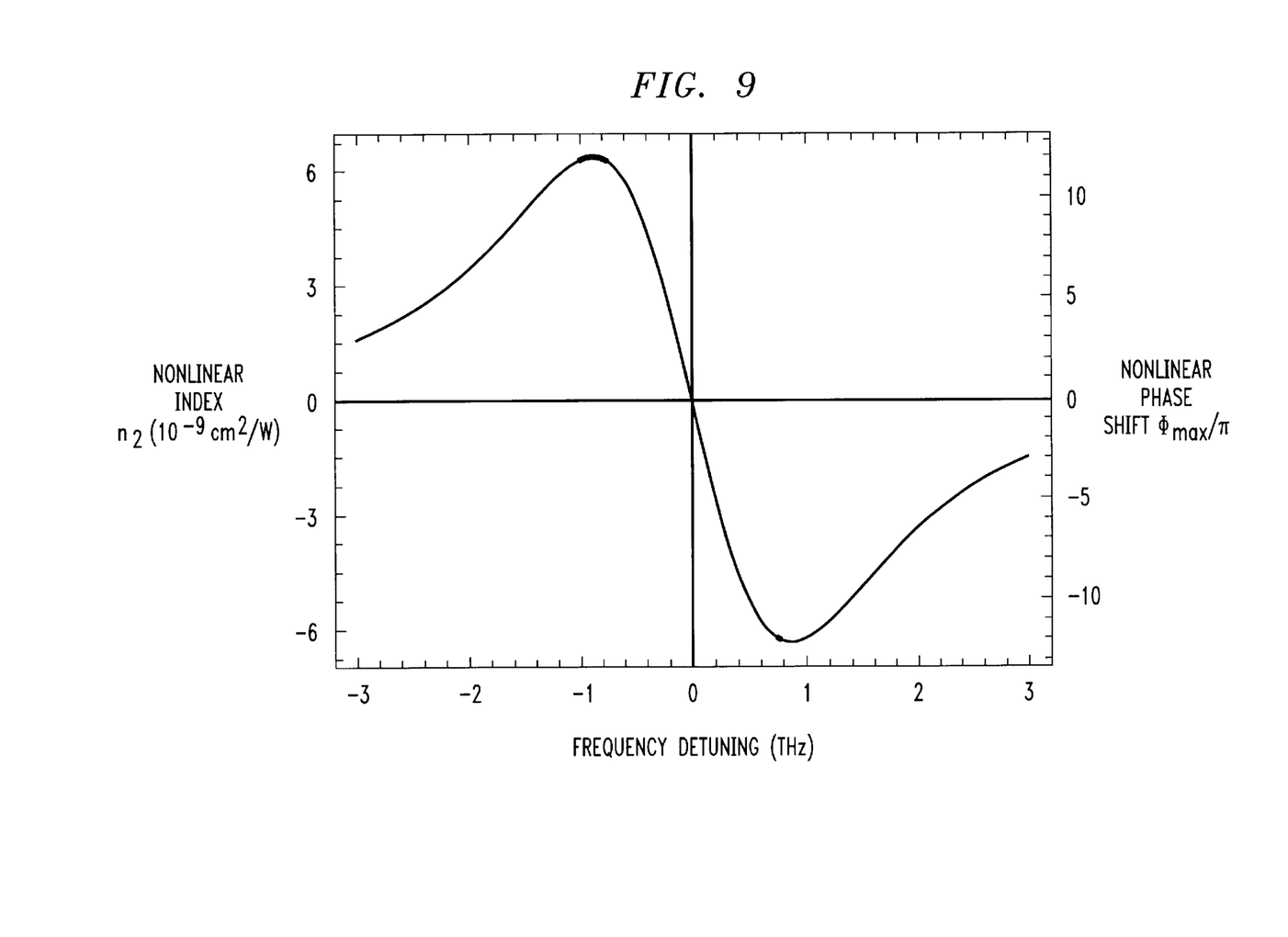
FIG. 9 illustrates the nonlinear refractive index $n_2$ of the lasing intersubband transition, computed used the parameter values of the SML QC laser associated with the graphs of FIG. 6.

As for the nonlinear index of the laser intersubband transition, it can be calculated from the following expression that is based on a two-level approximation:

$$n_2 = \frac{q^2 z_{32}^2 \Delta N}{2n\varepsilon_0 h} \frac{\Delta v^2(v_0 - v)}{[\Delta v^2 + (v_0 - v)^2]^2} \frac{1}{I_{sat}},$$

where $Z_{32}$ is the dipole moment of the lasing transition, ΔN is the population inversion per unit volume, n is the background refractive index, $v_0$ and Δv are the center frequency and the FWHM of the gain curve, $I_{sat}$ is the saturation intensity, and q, $\varepsilon_0$, and h are the unit charge, vacuum permittivity, and Planck's constant, respectively. Using typical QC-laser parameter values, an exemplary nonlinear index is plotted in FIG. 9, as a function of the optical frequency v. Referring to FIG. 9, it is shown that $n_2$ has the value of zero at the gain center frequency $v_0$, which is a general property of the Kramers-Kronig transform of a symmetrical function. However, at frequencies detuned from $v_0$ by as little as 100 GHz, $n_2$ is already large enough (approximately $10^{-9}$ cm²/W) to justify the experimental findings. For the purposes of illustration, the right axis of FIG. 9 was scaled to display $\phi_{max}$ versus v, using equation (2) with parameter values corresponding to the spectrum of FIG. 5 at 600 mA. The phase shift $\phi_{max}$=3/2 π, required to explain the spectral shapes of FIG. 6, is reached at a detuning of less than 100 GHz. Furthermore, the relaxation lifetime of this nonlinearity, given by the lifetime of the laser population inversion, is a few picoseconds (by design), which is consistent with the measured pulse widths.

It is to be noted that self-focusing requires a positive value of $n_2$, whereas the nonlinear index plotted in FIG. 9 changes sign at $v=v_0$. The optical bandwidths observed under conditions of SML extend over several hundreds of GHz around $v_0$ so that they sample both signs of $n_2$. However, in these measurements it was consistently found that the centers of mass of the optical spectra lie at frequencies lower than $v_0$, where $n_2$ is positive. This is, of course, in agreement with the observation of narrower beam profiles at higher intensities. Thus, it can be argued that self-mode-locking is initiated by modes with frequencies below $v_0$ through the self-focusing mechanism described above. Once these modes are locked in phase, their mutual beating produces a large enough modulation of the laser gain to bring several other modes above threshold.

What is claimed is:

1. A quantum cascade (QC) laser comprising a multilayer optical structure, said structure comprising a core region of relatively large effective refractive index disposed between top and bottom cladding layers of relatively small effective refractive index, the core region comprising a multiplicity of nominally identical repeat units, each repeat unit comprising an active region and a carrier injection region, the active region having a layer structure selected to provide an upper and a lower carrier energy state, such that a carrier transition from the upper to the lower energy state results in emission of a photon of wavelength $\lambda$, the carrier injection region having a layer structure selected to facilitate carrier transport from the lower energy state of the active region of a given repeat unit to the upper energy state of the active region of an adjacent downstream repeat unit, the top and bottom cladding layers disposed on either side of said core region, wherein at least said top cladding layer and said core region form a mesa structure;

an insulating layer covering exposed surfaces of said cladding layers and said core region; and electrical contacts attached to the top and bottom cladding layers for facilitating the flow of electric current through the laser characterized in that the quantum cascade laser is self-mode-locking, wherein the insulating layer comprises a relatively thin layer of less than a micron in depth and the quantum cascade laser further comprises optically lossy sidewalls disposed to cover said relatively thin insulating layer in at least the area of said active region to provide mode coupling between said optically lossy sidewalls and said active region, said quantum cascade laser further comprising a relatively long active region cavity having a length of at least 3.5 mm so as to be sufficient for propagation losses to be greater than mirror losses.

2. A quantum cascade laser as defined in claim 1 wherein the laser is self-mode locking and comprises an insulating layer less than 0.5 microns in depth.

3. A quantum cascade laser as defined in claim 1 wherein the insulating layer comprises silicon nitride.

4. A quantum cascade laser as defined in claim 1 wherein the insulating layer comprises silicon dioxide.

5. A quantum cascade laser as defined in claim 1 wherein the laser emits an output wavelength in the mid-infrared region.

6. A quantum cascade laser as defined in claim 5 wherein the laser emits at a wavelength of approximately 5 $\mu$m.

7. A quantum cascade laser as defined in claim 5 wherein the laser emits at a wavelength of approximately 8 $\mu$m.

8. A quantum cascade laser as defined in claim 1 wherein each pulse output is of a width less than five picoseconds.

9. A quantum cascade laser as defined in claim 1 wherein the optically lossy sidewall layers comprise a metal material and form a continuous layer with a top electrical contact to the upper cladding region.

10. A quantam cascade laser as defined in claim 9 wherein the metal material comprises gold.

11. A quantum cascade laser as defined in claim 1 wherein the optically lossy sidewall layers are separate from the top electrical contact.

12. A quantum cascade laser as defined in claim 11 wherein the optically lossy sidewall layers comprise metallic layers.

13. A quantum cascade laser as defined in claim 12 wherein the sidewall metallic layers comprise the same material as the top electrical contact.

14. A quantum cascade laser as defined in claim 13 wherein the sidewall metallic layers and the top electric contact comprise gold.

15. A quantum cascade laser as defined in claim 11 wherein the optically lossy sidewall layers comprise polymeric substances.

16. A quantum cascade laser as defined in claim 1 wherein the upper and lower cladding layers comprise a plurality of InGaAs/AlInAs epitaxial layers.

17. A quantum cascade laser as defined in claim 1 wherein the optically lossy layers are electrically insulating and incorporate the insulating layer.

* * * * *